(12) United States Patent
He

(10) Patent No.: US 10,795,219 B2
(45) Date of Patent: Oct. 6, 2020

(54) SUBSTRATE, DISPLAY PANEL, AND DISPLAY DEVICE

(71) Applicant: HKC Corporation Limited, Shenzhen, Guangdong (CN)

(72) Inventor: Huailiang He, Guangdong (CN)

(73) Assignee: HKC Corporation Limited, Shenzhen (CN)

(*) Notice: Subject to any disclaimer, the term of this patent is extended or adjusted under 35 U.S.C. 154(b) by 0 days.

(21) Appl. No.: 16/426,020

(22) Filed: May 30, 2019

(65) Prior Publication Data

US 2020/0166810 A1    May 28, 2020

Related U.S. Application Data

(63) Continuation of application No. PCT/CN2018/122106, filed on Dec. 19, 2018.

(30) Foreign Application Priority Data

Nov. 22, 2018  (CN) .......................... 2018 2 1940063

(51) Int. Cl.
*G02F 1/1343* (2006.01)
*G02F 1/1362* (2006.01)
*G02F 1/1368* (2006.01)

(52) U.S. Cl.
CPC ...... *G02F 1/134336* (2013.01); *G02F 1/1368* (2013.01); *G02F 1/136209* (2013.01); *G02F 1/136286* (2013.01)

(58) Field of Classification Search
CPC ................................................ G02F 1/134336
See application file for complete search history.

(56) References Cited

U.S. PATENT DOCUMENTS

| | | | |
|---|---|---|---|
| 2005/0112906 A1* | 5/2005 | Maekawa | H01L 29/66765 438/795 |
| 2006/0170854 A1* | 8/2006 | Han | G02F 1/1339 349/153 |
| 2009/0262292 A1* | 10/2009 | Lee | G02F 1/1345 349/149 |
| 2013/0271675 A1* | 10/2013 | Misaki | G06F 3/044 349/12 |
| 2018/0107037 A1* | 4/2018 | Lee | H01L 29/786 |
| 2018/0188584 A1* | 7/2018 | Yeh | G02F 1/1339 |

* cited by examiner

*Primary Examiner* — Sang V Nguyen

(57) ABSTRACT

The present disclosure discloses a substrate, a display panel and a display device. The substrate includes a substrate body, a fan-out layer including a plurality of traces, the plurality of traces being arranged at intervals, and a transparent conductive layer defined as a different layer from the fan-out layer. The fan-out layer is located between the substrate body and the transparent conductive layer, the transparent conductive layer includes a plurality of pattern groups, which are arranged at intervals, the pattern groups and the traces are alternately defined, the pattern group includes a plurality of conductive patterns, which are arranged at intervals.

17 Claims, 5 Drawing Sheets

SUBSTRATE, DISPLAY PANEL, AND DISPLAY DEVICE

This application is a Continuation Application of PCT Application No. PCT/CN2018/122106 filed on Dec. 19, 2018, which claims the benefit of Chinese Patent Application No. 201821940063.5, filed with the Chinese Patent Office on Nov. 22, 2018 and entitled "SUBSTRATE, DISPLAY PANEL, AND DISPLAY DEVICE", which is incorporated herein by reference in its entirety.

FIELD

The present disclosure relates to the field of display technology, and in particular, relates to a substrate, a display panel, and a display device.

BACKGROUND

More and more display panels are developed towards high reliability, and the reliability of fan-out region of display panel has become the focus of attention. Display region of the display panel need to be defined with transparent conductive layer, and the transparent conductive layer forms pixel electrodes in the display region. Transparent conductive layer is also required in the fan-out region to form conductive lines when considering the etching balance during formation of the pixel electrodes in the display region, to assure the uniformity of the widths of the pixel electrodes and the uniformity of space among the pixel electrodes. Due to the process, the fan-out region may be adhered with residual particles, which are prone to result in a short circuit when contacting the traces and conductive lines, thus increasing the capacitance of the fan-out region, and generating signal delay between the fan-out region and the signal line of the display region. Signal delay may cause insufficient charging, which results in a weak line defect of the display panel.

The description herein is only for providing background information that related to the present disclosure, rather than definitely constituting the prior art.

SUMMARY

The main purpose of the present disclosure is to provide a substrate, aiming at solving the problem of increased capacitance caused by the residual particles adhered to the fan-out region of the substrate.

In order to realize the above purpose, the present disclosure discloses a substrate, and in some embodiments of the present disclosure, the substrate includes:

a substrate body, defined with a display region and a non-display region;

a fan-out layer, defined in the non-display region of the substrate body, the fan-out layer including a plurality of traces which are arranged at intervals, and a transparent conductive layer, defined in the non-display region of the substrate body as a different layer from the fan-out layer, the fan-out layer being located between the substrate body and the transparent conductive layer; the transparent conductive layer comprising a plurality of pattern groups which are arranged at intervals, the pattern groups and the traces being alternately defined, the pattern group comprising a plurality of conductive patterns which are arranged at intervals.

In some embodiments of the present disclosure, the plurality of conductive patterns are sequentially defined at intervals along the extending direction of a gap between adjacent traces.

In some embodiments of the present disclosure, the distances between any two adjacent conductive patterns are equal.

In some embodiments of the present disclosure, the conductive patterns are dotted distributed.

In some embodiments of the present disclosure, the periphery profile of the conductive pattern is circular.

In some embodiments of the present disclosure, the diameter of the circle formed by the periphery profile of the conductive pattern is no less than 3 microns.

In some embodiments of the present disclosure, the conductive patterns are shaped as bar.

In some embodiments of the present disclosure, the conductive patterns are made of indium tin oxide.

The present disclosure also discloses a display panel, and in some embodiments of the present disclosure, the display panel includes a substrate:

the substrate includes:

a substrate body, defined with a display region and a non-display region;

a fan-out layer, defined in the non-display region of the substrate body, the fan-out layer including a plurality of traces which are arranged at intervals, and a transparent conductive layer, defined in the non-display region of the substrate body as a different layer from the fan-out layer, the fan-out layer being located between the substrate body and the transparent conductive layer; the transparent conductive layer comprising a plurality of pattern groups which are arranged at intervals, the pattern groups and the traces being alternately defined, the pattern group comprising a plurality of conductive patterns which are arranged at intervals.

In some embodiments of the present disclosure, the plurality of conductive patterns are sequentially defined at intervals along the extending direction of a gap between adjacent traces.

In some embodiments of the present disclosure, the distances between any two adjacent conductive patterns are equal.

In some embodiments of the present disclosure, the conductive patterns are dotted distributed.

In some embodiments of the present disclosure, the periphery profile of the conductive pattern is circular.

In some embodiments of the present disclosure, the diameter of the circle formed by the periphery profile of the conductive pattern is no less than 3 microns.

In some embodiments of the present disclosure, the conductive patterns are shaped as bar.

In some embodiments of the present disclosure, the conductive patterns are made of indium tin oxide.

In some embodiments of the present disclosure, the substrate is an array substrate;

the display panel further comprises:

a color film substrate, defined facing to the array substrate; and a liquid crystal layer, defined between the color film substrate and the array substrate.

The present disclosure also discloses a display device, and in some embodiments of the present disclosure, the display device includes a display panel:

the display panel including a substrate;
the substrate includes:
a substrate body, defined with a display region and a non-display region;
a fan-out layer, defined in the non-display region of the substrate body, the fan-out layer including a plurality of traces which are arranged at intervals, and
a transparent conductive layer, defined in the non-display region of the substrate body as a different layer from the fan-out layer, the fan-out layer being located between the substrate body and the transparent conductive layer; the transparent conductive layer comprising a plurality of pattern groups which are arranged at intervals, the pattern groups and the traces being alternately defined, the pattern group comprising a plurality of conductive patterns which are arranged at intervals.

In some embodiments of the present disclosure, the plurality of conductive patterns are sequentially defined at intervals along the extending direction of a gap between adjacent traces.

In some embodiments of the present disclosure, the display device also includes:

a backlight source; and
a housing, the display panel and the backlight source being mounted to the housing, and the backlight source being defined behind the display panel.

According to the technical schemes of the present disclosure, a transparent conductive layer is defined in the non-display region of the substrate body, the transparent conductive layer, being defined as a different layer from the fan-out layer, includes a plurality of pattern groups, and the pattern group includes a plurality of conductive patterns, which are defined at intervals. The residual particles conduct the conductive patterns and the traces after adhering to the area where the fan-out layer of the non-display region is located. Due to the interval definition of the conductive patterns, adjacent conductive patterns are insulated from each other, thereby the capacitance increased by the traces may be very small, not large enough to cause the delay of the signal from the trace of the fan-out layer to the data line of the display region, thereby avoiding the weak line defect of the display panel.

BRIEF DESCRIPTION OF THE DRAWINGS

In order to more clearly explain the embodiments of the present disclosure or the technical schemes in the prior art, the drawings that need to be used in the embodiments or the description of the prior art will be briefly introduced below. Obviously, the drawings in the following description are only some embodiments of the present disclosure. For those of ordinary skill in the art, other drawings may be obtained according to the structures shown in these drawings without paying creative labor.

BRIEF DESCRIPTION OF THE DRAWINGS

Figure 1:
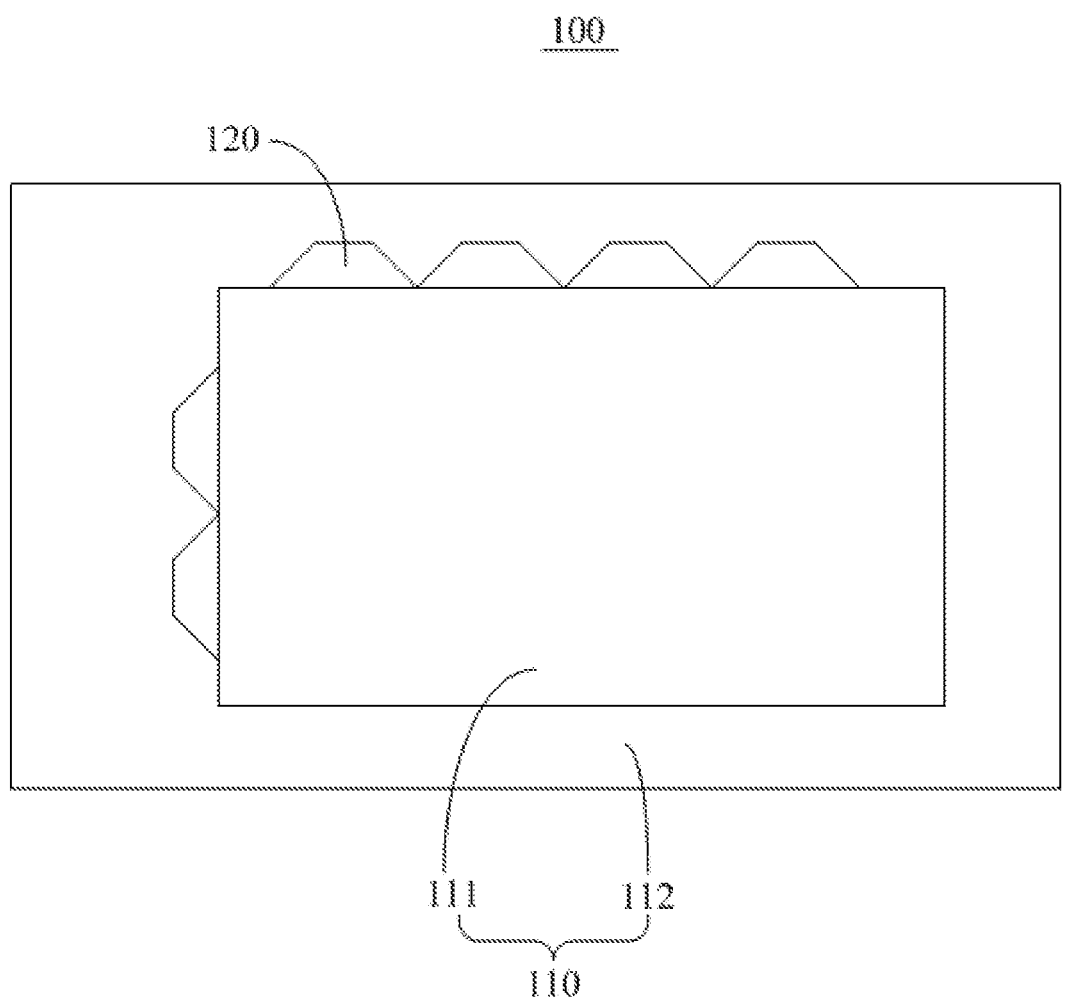
FIG. 1 is a partial structural diagram of a substrate in some embodiments of the present disclosure.

| Label | Name |
| --- | --- |
| 100 | base |
| 110 | substrate body |
| 111 | display region |
| 112 | non-display region |
| 120 | fan-out layer |
| 121 | trace |
| 1211 | gap |
| 130 | transparent conductive layer |
| 131 | pattern group |
| 1311 | conductive pattern |

The realization, functional features and advantages of the present disclosure will be further described with reference to the accompanying drawings in conjunction with the embodiments.

DETAILED DESCRIPTION OF THE EMBODIMENTS

The technical scheme in the embodiment of the present disclosure will be described clearly and completely in the following with reference to the drawings in the embodiment of the present disclosure. Obviously, the described embodiment is only a part of the embodiment of the present disclosure, but not all of the embodiments. All other embodiments obtained by persons skilled in the art based on the embodiments of the present disclosure without creative efforts shall fall within the protection scope of the present disclosure.

It should be noted that all directional indications (such as up, down, left, right, front, back, etc.) in the embodiments of the present disclosure are only used to explain the relative positional relationship, movement, etc. between the components in a certain posture (as shown in the drawings), and if the specific posture changes, the directional indication changes accordingly.

In this disclosure, unless otherwise expressly specified and defined, the terms "connect", "fix" and the like shall be understood in a broad sense, for example, "fix" may be a fixed connection, a detachable connection, or an integral body; It can be a mechanical connection or an electrical connection. It can be directly connected or indirectly connected through an intermediate medium. It can be the internal communication of two elements or the interaction relationship between two elements, unless otherwise explicitly defined. For those of ordinary skill in the art, the specific meaning of the above terms in this disclosure can be understood according to the specific circumstances.

In addition, in this disclosure, the descriptions such as "first" and "second" are set for the purpose of description only, and are not to be understood as indicating or implying its relative importance or implicitly indicating the number of indicated technical features. Thus, features defining "first" and "second" may explicitly or implicitly include at least one such feature. In addition, the technical schemes between the various embodiments may be combined with each other, but must be based on what one of ordinary skill in the art may achieve. When the combination of technical schemes is contradictory or impossible to achieve, it should be considered that the combination of such technical schemes does not exist and is not within the scope of protection required by the present disclosure.

Display device is a device for outputting information, it is also referred as displayer, it may convert computer datum into various words, figures, signs or pictures to be displayed. Display devices may be divided into categories such as liquid crystal display, organic light emitting diode display, and so on, according to different principles.

Substrate 100 is required to apply to the display panel of displayer such as liquid crystal display and organic light emitting diode display. Taking liquid crystal display for instance, the display panel of liquid crystal display consists of array substrate and color film substrate, liquid crystal is filled between the array substrate and the color film substrate. Array substrate and color film substrate are respectively one kind of substrate, the materials of them may be the same, and the structures of them formed are different. Taking organic light emitting diode display for instance, organic light emitting diode display is defined with array substrate, the array substrate is defined with organic light emitting layer thereon. That is, substrate 100 is an important member of display panel of display device. After the manufacturing of the display panel using the substrate 100, the display panel and backlight source are mounted to the housing, forming a display device.

In order to realize the display of the content of the display panel, it is required to drive the display region 111 of the substrate 100. Taking liquid crystal panel for instance, the substrate 100 defines a display region 111 and a non-display region 112, the non-display region 112 needs to define driving chip, which needs to connect with display region 111 through trace 121. Due to the difference between the width of the part of the driving chip that transmitting signals and the width of the part of the corresponding display region 111 that transmitting signals, the trace 121 of the non-display region 112 is required to form a fan-shaped structure. That is, the display region 111 include a plurality of scanning lines and a plurality of data lines, the plurality of scanning lines and the plurality of data lines crisscross to form a plurality of pixel units, the trace 121 is required for the pin of the driving chip when connecting to the scanning line or the data line.

In order to drive the display area 111, it is necessary to form a pixel electrode in the display area 111. The pixel electrode functions to apply a voltage to the liquid crystal display. The material of the pixel electrode may be transparent conductive materials such as ITO (indium tin oxide), IZO (indium zinc oxide), AZO (aluminum doped zinc oxide), GZO (gallium doped zinc oxide), etc. Taking ITO as an example to illustrate the formation of pixel electrodes, first, ITO film is formed by sputtering in the display area 111, after being coated with photoresist, the ITO film is exposed and developed, then ITO film is etched, and finally photoresist is peeled off to form pixel electrodes (pixel ITO). Considering the etching balance when etching the pixel electrode in the display region 111 and to assure the uniformity of the widths of the pixel electrodes and the uniformity of space among the pixel electrodes, it is currently necessary to further provide an ITO film in the non-display region 111 and to etch the ITO film to form a dummy ITO.

Due to the process, residual particles may adhere to the region where the traces 121 are located, and the residual particles may easily result in a short circuit after contacting the traces 121 and the conductive lines, thus increasing the capacitance of the traces 121 of the fan-out layer 12, and resulting in signal delay between the traces 121 and the signal lines of the display area 111, thereby causing insufficient charging after the signal delay, and forming a weak line defect phenomenon of the display panel.

Therefore, in order to prevent excessive capacitance caused by residual particles on the premise of ensuring etching balance, the main solution of the present disclosure is that the transparent conductive layer 130 is defined in the non-display region 112 of the substrate body 110 and in a different layer from the fan-out layer 120, the fan-out layer 120 is located between the substrate body 110 and the transparent conductive layer 130. The transparent conductive layer 130 includes a plurality of pattern groups 131 arranged at intervals, the pattern groups 131 and the traces 121 are alternately defined, the pattern group 131 includes a plurality of conductive patterns 1311, and the plurality of conductive patterns 1311 are defined alternately. By arranging the conductive patterns 1311 at intervals, even under the situation that the residual particles adhere to the region where the traces 121 are located, the increased capacitance may be made very small without causing signal delay when the residual particles conduct the conductive patterns 1311 and the traces 121.

Based on above problems, the present disclosure proposes an array substrate 100.

In some embodiments of the present disclosure, as FIGS. 1 to 5 shown, the substrate 100 includes:

a substrate body 110, defined with a display region 111 and a non-display region 112;

a fan-out layer 120, defined in the non-display region 112 of the substrate body 110, the fan-out layer 120 including a plurality of traces 121 which are arranged at intervals, and a transparent conductive layer 130, defined in the non-display region 112 of the substrate body 110 and in a different layer from the fan-out layer 120, the fan-out layer 120 is located between the substrate body 110 and the transparent conductive layer 130. The transparent conductive layer 130 includes a plurality of pattern groups 131 arranged at intervals, the pattern groups 131 and the traces 121 are alternately defined, the pattern group 131 includes a plurality of conductive patterns 1311, and the plurality of conductive patterns 1311 are defined alternately.

Figure 2:
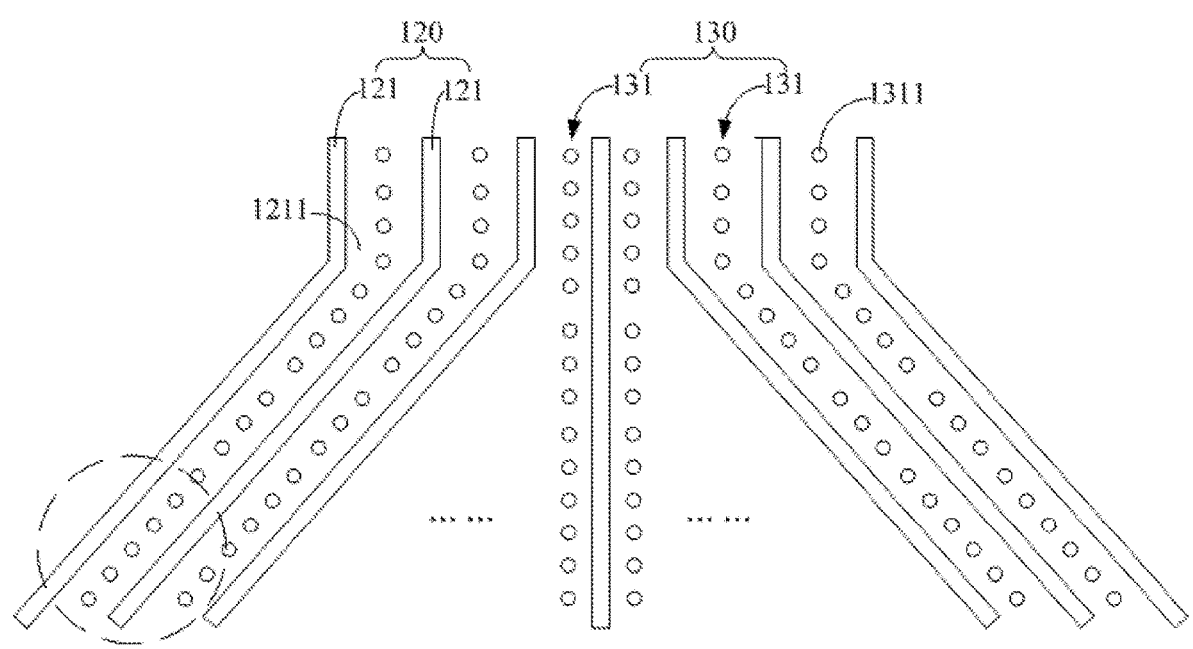
FIG. 2 is a partial structural diagram of the fan-out layer and the transparent conductive layer in some embodiments of the present disclosure.
Figure 4:
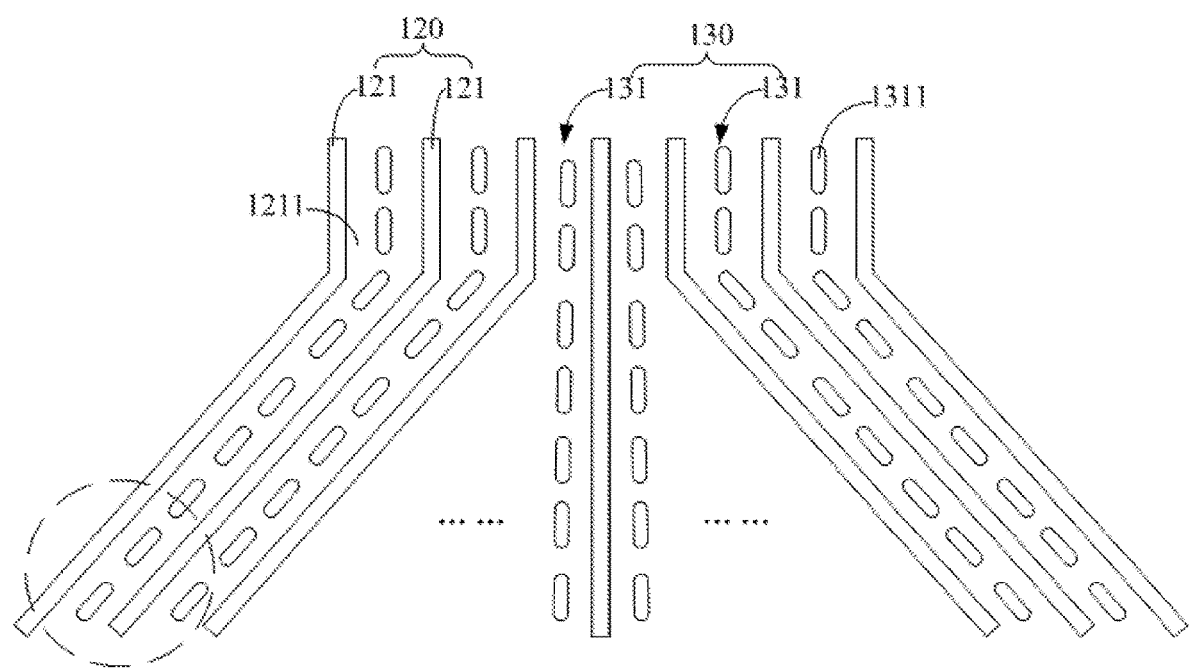
FIG. 4 is a partial structural diagram of the fan-out layer and the transparent conductive layer in some embodiments of the present disclosure.

In this embodiment, the fan-out layer 120 includes a plurality of traces 121 formed in the non-display region 112 of the substrate body 110, and then a transparent conductive layer 130 is formed on the fan-out layer 120, the transparent conductive layer 130 is made of transparent conductive materials such as ITO (indium tin oxide), IZO (indium zinc oxide), AZO (aluminum doped zinc oxide), GZO (gallium doped zinc oxide), etc. Referring specifically to FIGS. 2 and 4, the transparent conductive layer 130 includes a plurality of pattern groups 131 arranged at intervals, the pattern groups 131 and the traces 121 are alternately defined, that is, in a projection of the same plane, the pattern groups 131 are located between two adjacent traces 121 and insulated from the traces 121. The pattern group 131 includes a plurality of conductive patterns 1311 which are insulated from each other. After the residual particles adhere to the region where the traces 121 are located, the residual particles conduct the traces 121 and the conductive patterns 1311. However, since the adjacent conductive patterns 1311 are arranged at intervals, that is, the adjacent conductive patterns 1311 are insulated from each other, even if the residual particles conduct the traces 121 and one of the conductive patterns 1311, the capacitance increased by the traces 121 of the fan-out layer 120 is still very small under such situation, so that no delay of the signal from the traces 121 of the fan-out layer to the signal line of the display region 111 may be caused. Thereby weak line defects may not occur to the display panel since no signal delay is caused. The weak line herein refers to a line formed on a picture that is incompatible with the contents of the picture.

The trace 121 may be formed by the following method:

Operation 1, cleaning the glass (substrate body 110) to remove foreign matters;

Operation 2, dividing the glass surface into the display region 111 and the non-display region 112;

Operation 3, forming a metal film in the non-display region 112 of the glass by sputtering deposition using a metal material;

Operation 4, coating photoresist on the formed metal film;

Operation 5, exposing by irradiating ultraviolet rays on the photoresist on the glass through a mask plate;

Operation 6, fusing the exposed portion of the photoresist by a developer solution, with the pattern of the rest part of the photoresist in a desired shape;

Operation 7, putting the glass into a corrosive liquid or corrosive gas to corrode the film without photoresist;

Operation 8, removing the residual photoresist, leaving the desired shape as the trace 121, thereby forming the fan-out layer 120 on the glass (substrate body 110).

The conductive pattern 131 has a certain shape and/or structure and is made of a transparent conductive material. When forming the transparent conductive layer 130, taking the material of ITO for instance, first, the ITO film is formed by sputtering in the display region 111 and the non-display region 112, then form the pixel electrode in the display region 111 and form the conductive pattern 1311 in the non-display region 112 by coating photoresist, exposure and development, and then etching the ITO film, and finally peeling off the photoresist.

In this embodiment, the conductive patterns 1311 are defined alternately, so that the capacitance formed by the trace 121 of the fan-out layer 120 is very small when the residual particles are adhered to the region where the traces 121 are located on the premise of ensuring etching balance, and the delay of the signal from the trace 121 of the fan-out layer to the signal line of the display region 111 is avoided.

Figure 3:
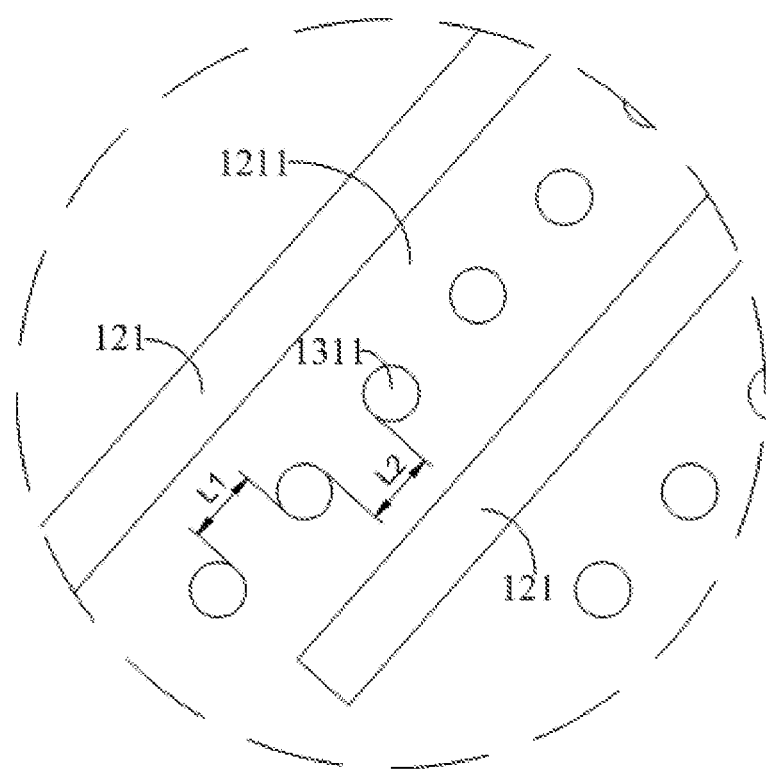
FIG. 3 is an enlarge view of the area indicated by dashed line in FIG. 2.

In some embodiments of the present disclosure, as FIGS. 2 to 4 show, the plurality of conductive patterns 1311 are sequentially defined along the extending direction of a gap 1211 between adjacent traces 121. That is, the adjacent two traces 121 are defined alternately, so a gap 1211 is provided between the adjacent two traces 121, and the conductive patterns 1311 are defined alternately along the extending direction of the gap 1211 to avoid short circuits caused by the aggregation of the conductive patterns 1311 at local locations. Moreover, due to the alternate definition of the conductive patterns 1311 along the extending direction of the gap 1211, more conductive patterns 1311 may be arranged in a limited space to ensure etching balance.

Figure 5:
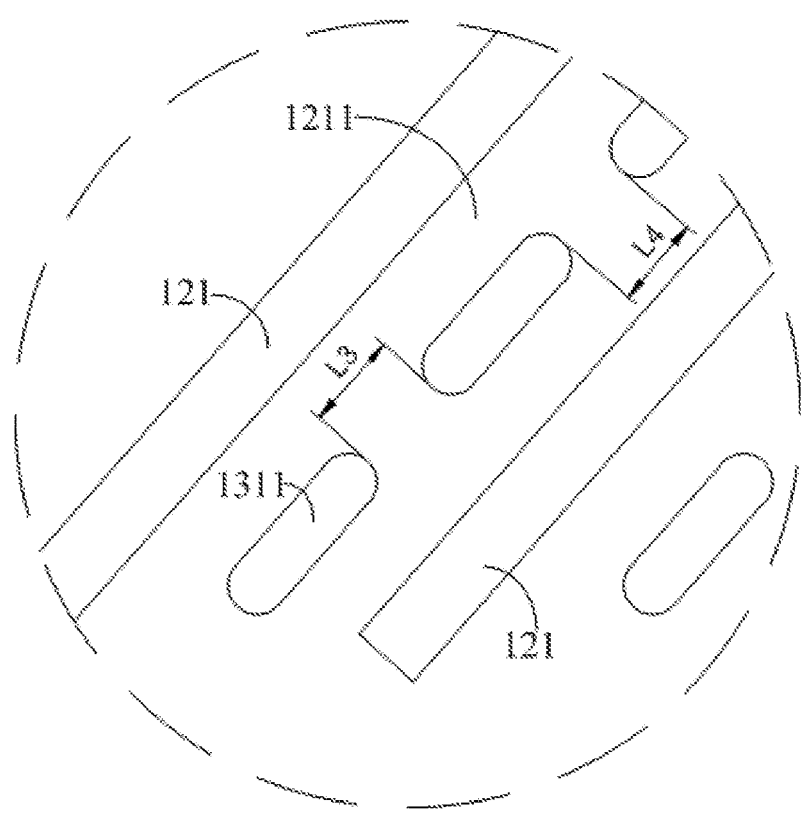
FIG. 5 is an enlarge view of the area indicated by dashed line in FIG. 4.

In some embodiments of the present disclosure, as shown in FIGS. 3 and 5, the distances between any two adjacent conductive patterns 1311 are equal, in FIG. 3, L1 is equal to L2, and in FIG. 4, L3 is equal to L4. As described above, the conductive pattern 1311 is formed by sputtering, photoresist coating, exposure and development, etching and other operations in sequence. Therefore, in this embodiment, the distances between any two adjacent conductive patterns 1311 are equal, i.e., the conductive patterns 1311 are evenly spaced. In this way, the over-concentration of the conductive patterns 1311 is avoided, and the process difficulty in the exposure and development stages is reduced.

The conductive patterns 1311 are evenly arranged at intervals to avoid local aggregation and prevent residual particles from covering multiple conductive patterns 1311 at the same time, thereby preventing the increase of capacitance.

The above-mentioned distance is the shortest distance.

In some embodiments of the present disclosure, as FIG. 2 and FIG. 3 show, the conductive patterns 1311 are dotted distributed. In this embodiment, the conductive patterns 1311 are dotted distributed, herein the peripheral profile of the conductive patterns 1311 may be circular, quadrangular, pentagonal, hexagonal, etc. Since the conductive patterns 1311 are dotted distributed, each conductive pattern 1311 may be made small enough, and the probability of the residual particles covering the conductive patterns 1311 is greatly reduced when the residual particles adhere to the area where the traces 121 are located, thereby further preventing the trace 121 from increasing the capacitance after the residual particles adhere to the area where the traces 121 are located.

In some embodiments of the present disclosure, the periphery profile of the conductive pattern 1311 is circular. In this embodiment, the peripheral profile of the conductive pattern 1311 is circular, and the stresses of the conductive pattern 1311 tend to be uniform in all directions, effectively preventing the conductive pattern 1311 from peeling off.

In some embodiments of the present disclosure, the diameter of the circle formed by the periphery profile of the conductive pattern 1311 is no less than 3 microns. In this embodiment, the diameter of the circle formed by the periphery profile of the conductive pattern 1311 is no less than 3 microns, so that the etching balance is ensured, and the maximum value of the diameter may be determined according to the distance between adjacent traces 121.

In some embodiments of the present disclosure, as FIG. 4 and FIG. 5 show, the conductive patterns 1311 are shaped as bar. In this embodiment, unlike the distribution of spot manner in the above embodiment, the conductive patterns 1311 are shaped as bar and the plurality of conductive patterns 1311 are integrally distributed in multiple segments. That is, the conductive pattern 1311 shaped as bar has a larger area than the spotty conductive patterns 131, and is easier to prepare and shape, thereby reducing the difficulty of manufacturing.

In some embodiments of the present disclosure, the conductive patterns 1311 are made of indium tin oxide. Generally speaking, indium tin oxide (ITO) is the most widely used material of pixel electrode, indium tin oxide is an N-type semiconductor material with semiconductor conductivity. Therefore, when forming the conductive pattern 1311, indium tin oxide may be manufactured simultaneously with the pixel electrode to ensure etching balance and improve production efficiency.

The present disclosure also disclosed a display panel.

In some embodiments of the present disclosure, the display panel includes the substrate 100 according to any of above embodiments;

the substrate 100 includes:

a substrate body 110, defined with a display region 111 and a non-display region 112;

a fan-out layer 120, defined in the non-display region 112 of the substrate body 110, the fan-out layer 120 including a plurality of traces 121 which are arranged at intervals, and a transparent conductive layer 130, defined in the non-display region 112 of the substrate body 110 and in a different layer from the fan-out layer 120, the fan-out layer 120 is located between the substrate body 110 and the transparent conductive layer 130. The transparent conductive layer 130 includes a plurality of pattern groups 131 arranged at intervals, the pattern groups 131 and the traces 121 are alternately defined, the pattern group 131 includes a plurality of conductive patterns 1311, and the plurality of conductive patterns 1311 are defined alternately.

According to this embodiment, the display panel includes a substrate 100, and the specific structure of the substrate 100 refers to the above embodiments. Since the substrate 100 of the display panel according to this embodiment adopts all the technical schemes of all the above embodiments, it has at least all the effects brought about by the technical schemes of the above embodiments, which will not be described in detail here.

In some embodiments of the present disclosure, the substrate 100 is an array substrate;

the display panel further comprises:

a color film substrate, defined facing to the array substrate; and a liquid crystal layer, defined between the color film substrate and the array substrate.

In this embodiment, the display region 111 on the array substrate is defined with a thin film transistor, signal lines (scanning line and data line), a pixel electrode, a storage capacitor, etc., while the non-display region 112 is defined with a trace 121 and a drive chip. Specifically, the display region 111 on the array substrate has a plurality of pixel units, each pixel unit includes a switching device thin film transistor, a storage capacitor and a pixel electrode, the gate electrode of the thin film transistor is connected to the scanning line, the source electrode of the thin film transistor is connected to the data line, the drain electrode is connected to the pixel electrode, and the drive chip is respectively connected to the scanning line and the data line through the trace 121.

The color film substrate is defined with a black matrix, a color filter film, an overcoat and a transparent conductive film ITO (indium tin oxide semiconductor transparent conductive film). The color filter film may be a color filter film of the three primary colors of red, green and blue, and each color filter film on the color film substrate corresponds to a unit pixel on the array substrate.

The liquid crystal layer is manufactured by mixing various liquid crystal molecules, which are filled between the color film substrate and the array substrate. As an anisotropic crystal, liquid crystal molecules form optical anisotropy, and the structure of optical anisotropy has polarization function. Under the control of applied voltage, the liquid crystal molecules deflect due to the dielectric anisotropy of the liquid crystal, making the refractive index or transmittance of the liquid crystal change correspondingly, thereby the light brightness is controlled. After canceling the applied voltage, the liquid crystal reverts by elastic potential energy to the same state as before being applied the external force.

The present disclosure also disclosed a display device.

In some embodiments of the present disclosure, the display device also includes a display panel according to any of above embodiments.

The display panel includes a substrate 100, the substrate 100 includes:

a substrate body 110, defined with a display region 111 and a non-display region 112;

a fan-out layer 120, defined in the non-display region 112 of the substrate body 110, the fan-out layer 120 including a plurality of traces 121 which are arranged at intervals, and a transparent conductive layer 130, defined in the non-display region 112 of the substrate body 110 and in a different layer from the fan-out layer 120, the fan-out layer 120 is located between the substrate body 110 and the transparent conductive layer 130. The transparent conductive layer 130 includes a plurality of pattern groups 131 arranged at intervals, the pattern groups 131 and the traces 121 are alternately defined, the pattern group 131 includes a plurality of conductive patterns 1311, and the plurality of conductive patterns 1311 are defined alternately.

According to this embodiment, the display device includes a display panel, the display panel includes a substrate 100, and the specific structure of the substrate 100 refers to the above embodiments. Since the substrate 100 of the display panel of the display device according to this embodiment adopts all the technical schemes of all the above embodiments, it has at least all the effects brought about by the technical schemes of the above embodiments, which will not be described in detail here.

In some embodiments of the present disclosure, the display device also includes:

a backlight source; and a housing, the display panel and the backlight source are mounted to the housing, the backlight source is defined behind the display panel.

In this embodiment, the backlight source is mainly composed of a light source, an optical film, a light guide plate, and other members. The light source determines the power consumption, brightness, color and other photoelectric parameters of the backlight source, as well as its service conditions and service life. The light sources are divided into three categories according to their luminous shapes: linear light sources, point light sources and planar light sources.

The backlight should provide a planar light source of high brightness and high uniformity to the display panel as possible. The optical films used in the backlight are mainly divided into two categories, one is diffusion film and reflection sheet, the main function of which is to enhance the uniformity of light emission from the planar light source, the other is incremental film, the main function of which is to improve the brightness of light emission from the backlight.

The light guide plate is to be set in an edge light type backlight so that the linear light emitted by the light source becomes planar light with good luminous efficiency. Mirror grinding the incident end of the light guide plate facing the light source may enable light with all incident angles to enter the light guide plate. The light emitted from the light guide plate has a large brightness when viewed from the lateral side. By configuring an optical film on the light guide plate, the brightness under the front viewing angle may achieve maximum.

The above are only the optional embodiments of the present disclosure and are not therefore limiting the scope of the patent disclosure. Any equivalent structural change made under the inventive concept of the present disclosure using the contents of the present disclosure specification and drawings, or directly/indirectly applied in other related technical fields, is included in the scope of the patent protection of the present disclosure.

What is claimed is:

1. A substrate, comprising:

a substrate body, defined with a display region and a non-display region;

a fan-out layer, defined in the non-display region of the substrate body, the fan-out layer comprising a plurality of traces which are arranged at intervals, and a transparent conductive layer, defined in the non-display region of the substrate body as a different layer from the fan-out layer, the fan-out layer being located between the substrate body and the transparent conductive layer; the transparent conductive layer comprising a plurality of pattern groups which are arranged at intervals, the pattern groups and the traces being alternately defined, each pattern of the pattern groups comprising a plurality of conductive patterns which are arranged at intervals, the plurality of conductive patterns are sequentially defined at intervals along the extending direction of a gap between adjacent traces.

2. The substrate according to claim 1, wherein the distances between any two adjacent conductive patterns are equal.

3. The substrate according to claim 1, wherein the conductive patterns are dotted distributed.

4. The substrate according to claim 3, wherein the periphery profile of the conductive pattern is circular.

5. The substrate according to claim 4, wherein the diameter of the circle formed by the periphery profile of the conductive pattern is no less than 3 microns.

6. The substrate according to claim 1, wherein the conductive patterns are shaped as bar.

7. The substrate according to claim 1, wherein the conductive patterns are made of indium tin oxide.

8. A display panel, comprising a substrate;
wherein the substrate comprises:
a substrate body, defined with a display region and a non-display region;
a fan-out layer, defined in the non-display region of the substrate body, the fan-out layer comprising a plurality of traces which are arranged at intervals, and
a transparent conductive layer, defined in the non-display region of the substrate body as a different layer from the fan-out layer, the fan-out layer being located between the substrate body and the transparent conductive layer; the transparent conductive layer comprising a plurality of pattern groups which are arranged at intervals, the pattern groups and the traces being alternately defined, each pattern of the pattern groups comprising a plurality of conductive patterns which are arranged at intervals, the plurality of conductive patterns are sequentially defined at intervals along the extending direction of a gap between adjacent traces.

9. The display panel according to claim 8, wherein the distances between any two adjacent conductive patterns are equal.

10. The display panel according to claim 8, wherein the conductive patterns are dotted distributed.

11. The display panel according to claim 10, wherein the periphery profile of the conductive pattern is circular.

12. The display panel according to claim 11, wherein the diameter of the circle formed by the periphery profile of the conductive pattern is no less than 3 microns.

13. The display panel according to claim 8, wherein the conductive patterns are shaped as bar.

14. The display panel according to claim 8, wherein the conductive patterns are made of indium tin oxide.

15. The display panel according to claim 8, wherein the substrate is an array substrate;
the display panel further comprises:
a color film substrate, defined facing to the array substrate; and
a liquid crystal layer, defined between the color film substrate and the array substrate.

16. A display device, comprising a display panel;
the display panel comprising a substrate;
wherein the substrate comprises:
a substrate body, defined with a display region and a non-display region;
a fan-out layer, defined in the non-display region of the substrate body, the fan-out layer comprising a plurality of traces which are arranged at intervals, and
a transparent conductive layer, defined in the non-display region of the substrate body as a different layer from the fan-out layer, the fan-out layer being located between the substrate body and the transparent conductive layer; the transparent conductive layer comprising a plurality of pattern groups which are arranged at intervals, the pattern groups and the traces being alternately defined, each pattern of the pattern groups comprising a plurality of conductive patterns which are arranged at intervals, the plurality of conductive patterns are sequentially defined at intervals along the extending direction of a gap between adjacent traces.

17. The display device of claim 16, further comprising:
a backlight source; and
a housing, the display panel and the backlight source being mounted to the housing, and the backlight source being defined behind the display panel.

* * * * *